United States Patent
Renshaw et al.

(10) Patent No.: US 11,943,864 B2
(45) Date of Patent: Mar. 26, 2024

(54) STRETCHABLE/CONFORMABLE ELECTRONIC AND OPTOELECTRONIC CIRCUITS, METHODS, AND APPLICATIONS

(71) Applicant: University of Central Florida Research Foundation, Inc., Orlando, FL (US)

(72) Inventors: Christopher Kyle Renshaw, Orlando, FL (US); Zhao Ma, Orlando, FL (US)

(73) Assignee: University of Central Florida Research Foundation, Inc., Orlando, FL (US)

(*) Notice: Subject to any disclaimer, the term of this patent is extended or adjusted under 35 U.S.C. 154(b) by 0 days.

(21) Appl. No.: 18/094,082

(22) Filed: Jan. 6, 2023

(65) Prior Publication Data

US 2023/0403792 A1    Dec. 14, 2023

Related U.S. Application Data

(63) Continuation of application No. 17/107,424, filed on Nov. 30, 2020, now Pat. No. 11,570,892, which is a
(Continued)

(51) Int. Cl.
*H05K 1/03* (2006.01)
*G02B 13/00* (2006.01)
(Continued)

(52) U.S. Cl.
CPC ....... *H05K 1/0393* (2013.01); *G02B 13/0085* (2013.01); *H01L 27/14627* (2013.01);
(Continued)

(58) Field of Classification Search
CPC .. H05K 1/0393; H05K 1/189; G02B 13/0085; H01L 27/14627; H10K 77/111; H10K 85/111; H10K 2102/311
See application file for complete search history.

(56) References Cited

U.S. PATENT DOCUMENTS 6,399,874 B1 * 6/2002 Olah ..................... H01L 31/052
                                                    136/246
7,638,708 B2 * 12/2009 Fork .................. H01L 31/0547
                                                    136/246
(Continued)

OTHER PUBLICATIONS

Dinyari, Rostam, "Curving monolithic silicon for nonplanar focal plane array applications", Appl. Phys. Lett. 92, 091114 (2008) (Year: 2008).
(Continued)

*Primary Examiner* — Caleb E Henry
(74) *Attorney, Agent, or Firm* — Suiter Swantz pc llo (57) ABSTRACT

A fabrication method for stretchable/conformable electronic and optoelectronic circuits and the resulting circuits. The method may utilize a variety of electronic materials including, but not limited to Silicon, GaAs, InSb, Pb Se, CdTe, organic semiconductors, metal oxide semiconductors and related alloys or hybrid combinations of the aforementioned materials. While a wide range of fabricated electronic/optoelectronic devices, circuits, and systems could be manufactured using the embodied technology, a hemispherical image sensor is an exemplary advantageous optoelectronic device that is enabled by this technology. Other applications include but are not limited to wearable electronics, flexible devices for the internet-of-things, and advanced imaging systems.

15 Claims, 12 Drawing Sheets

Related U.S. Application Data continuation of application No. 15/948,065, filed on Apr. 9, 2018, now Pat. No. 10,856,413.

(60) Provisional application No. 62/482,936, filed on Apr. 7, 2017.

(51) Int. Cl.
    *H01L 27/146*     (2006.01)
    *H05K 1/18*     (2006.01)
    *H10K 77/10*     (2023.01)
    *H10K 85/10*     (2023.01)
    *H10K 102/00*     (2023.01)

(52) U.S. Cl.
    CPC .......... *H10K 77/111* (2023.02); *H10K 85/111* (2023.02); *H05K 1/189* (2013.01); *H10K 2102/311* (2023.02)

(56) References Cited

U.S. PATENT DOCUMENTS

| | | | |
|---|---|---|---|
| 9,065,010 B2 | 6/2015 | Forrest et al. | |
| 9,244,253 B2 | 1/2016 | Chen et al. | |
| 9,373,666 B2 | 6/2016 | Forrest et al. | |
| 9,568,800 B1* | 2/2017 | Sprague | G02F 1/16753 |
| 2006/0039098 A1* | 2/2006 | Slikkerveer | G09F 11/00 361/500 |
| 2008/0099063 A1* | 5/2008 | Armstrong | H01L 31/048 136/249 |
| 2008/0236655 A1* | 10/2008 | Baldwin | H01L 31/0516 228/256 |
| 2009/0032087 A1* | 2/2009 | Kalejs | H01L 31/0516 136/246 |
| 2009/0223555 A1* | 9/2009 | Ammar | H01L 31/0543 136/246 |
| 2010/0171683 A1* | 7/2010 | Huitema | G06F 1/1615 345/55 |
| 2010/0178722 A1* | 7/2010 | de Graff | H01L 27/14645 438/73 |
| 2010/0224950 A1* | 9/2010 | Dinyari | B81B 7/04 438/689 |
| 2010/0282288 A1* | 11/2010 | Cornfeld | H01L 31/0508 156/305 |
| 2010/0298895 A1* | 11/2010 | Ghaffari | A61B 5/02028 607/116 |
| 2011/0061478 A1* | 3/2011 | Ivanov | C03B 37/028 427/98.5 |
| 2011/0235160 A1* | 9/2011 | Hsieh | H10K 50/844 359/296 |
| 2013/0020666 A1* | 1/2013 | Smith | H01L 27/1465 257/E31.093 |
| 2013/0146120 A1* | 6/2013 | Seel | H01L 31/0512 136/246 |
| 2013/0288425 A1* | 10/2013 | Rana | B23K 26/40 438/98 |
| 2013/0306971 A1* | 11/2013 | Bedell | H01L 27/1203 257/E33.012 |
| 2013/0316487 A1* | 11/2013 | de Graff | A61B 1/04 438/66 |
| 2014/0232912 A1* | 8/2014 | Morimoto | H04N 23/11 348/270 |
| 2014/0303452 A1* | 10/2014 | Ghaffari | H01L 27/14687 601/3 |
| 2014/0370650 A1* | 12/2014 | Moslehi | H01L 27/1421 438/98 |
| 2015/0155398 A1* | 6/2015 | Moslehi | H01L 31/0516 136/244 |
| 2015/0171240 A1* | 6/2015 | Kapur | H01L 31/0516 438/98 |
| 2015/0255438 A1* | 9/2015 | Oraw | H01L 25/0753 257/89 |
| 2015/0340346 A1* | 11/2015 | Chu | H01L 33/50 257/89 |
| 2016/0004117 A1* | 1/2016 | Yu | G02F 1/133308 428/596 |
| 2016/0035924 A1* | 2/2016 | Oraw | H01L 31/0508 257/89 |
| 2016/0049441 A1* | 2/2016 | Shieh | H01L 27/14612 257/43 |
| 2016/0372690 A1* | 12/2016 | Hack | H10K 77/111 |
| 2017/0031389 A1* | 2/2017 | Yoo | G06F 3/0443 |
| 2017/0062532 A1* | 3/2017 | Jeong | H10K 59/131 |
| 2017/0338182 A1* | 11/2017 | Gross | C03C 17/326 |
| 2017/0338363 A1* | 11/2017 | Wright | H01L 31/048 |
| 2018/0004252 A1* | 1/2018 | Ahrens | G06F 1/1652 |
| 2018/0013023 A1* | 1/2018 | Moslehi | H01L 31/0682 |

OTHER PUBLICATIONS

Dinyari, Rostam, et al., "Curving monolithic silicon for nonplanar focal plane array applications", Applied Physics Letters, vol. 92, issue 9, p. 091114, published online Mar. 5, 2008, .COPYRGT. 2008 American Institute of Physics, Abstract provided, 8 pages.

Ko, Heung Cho et al., "A hemispherical electronic eye camera based on compressible silicon optoelectronics", Nature vol. 454, issue 7205, p. 748-753, published Aug. 7, 2008, .COPYRGT. 2018 Springer Nature Limited, Abstract provided, 9 pages.

Stamenov, Igor, et al., "Panoramic monocentric imaging using fiber-coupled focal planes", Optics Express, vol. 22, issue 26, pp. 31708-31721, published Dec. 15, 2014, 2014 .COPYRGT. Optical Society of America, 14 pages.

Street, Robert A. et al., "TFT Backplane Technologies for Advanced Array Applications", IEEE IEDM, 2015, pp. 137-140, vol. 15, IEEE.

Tekaya, Kevin, et al., "Hemispherical curved monolithic cooled and uncooled infrared focal plane arrays for compact cameras", Proceedings of the SPIE: IR Technology and Applications, vol. 9070, p. 90702T-1, published Jun. 24, 2018, abstract provided, 1 page.

Wagner, Sigurd et al, "Materials for Stretchable Electronics", Materials Research Society Bulletin, Mar. 2012, pp. 207-213, vol. 37, issue No. 3, Materials Research Society.

Wu, Tao, et al., "Design and fabrication of silicon tessellated structures for monocentric imagers", Microsystems & Nanoengineering, vol. 2, p. 16019, published online May 23, 2016, doi:10.1038/micronano.2016.19, 9 pages.

Xu, Xin, et al., "Direct Transfer Patterning on Three Dimensionally Deformed Surfaces at Micrometer Resolutions and its Application to Hemispherical Focal Plane Detector Arrays", Organic Electronics, vol. 9, Issue 6, pp. 1122-1127, Dec. 2008, Abstract provided, 3 pages.

* cited by examiner

STRETCHABLE/CONFORMABLE ELECTRONIC AND OPTOELECTRONIC CIRCUITS, METHODS, AND APPLICATIONS

CROSS-REFERENCE TO RELATED APPLICATION

The present application is a continuation of and claims the benefit of U.S. patent application Ser. No. 17/107,424 filed on Nov. 30, 2020, which claims the benefit of U.S. patent application Ser. No. 15/948,065 filed on Apr. 9, 2018 and issued on Dec. 1, 2020 as U.S. Pat. No. 10,856,413, which claims the benefit of U.S. Provisional Application No. 62/482,936 filed on Apr. 7, 2017, all of which are incorporated herein by reference in the entirety.

FIELD OF THE INVENTION

Aspects and embodiments of the invention pertain to flexible electronic and optoelectronic circuits, methods for fabricating said flexible electronic and optoelectronic circuits, and applications thereof including but not limited to wearable electronics, flexible devices for the internet-of-things, advanced imaging systems, biometric sensor systems, and microprocessors; more particularly to stretchable/conformable electronic and optoelectronic circuits, methods for fabricating said stretchable/conformable electronic and optoelectronic circuits, and applications thereof; most particularly to stretchable/conformable focal plane arrays (FPAs), methods for fabricating said stretchable/conformable FPAs, and applications thereof.

BACKGROUND

Flexible electronic circuits are desirable for a wide range of applications. Conventional electronic materials (Silicon, GaAs, InP, InSb, HgCdTe, GaN, and related materials) are inherently rigid and the desire for flexible electronics has motivated development of novel electronic materials that are inherently flexible and stretchable, such as metal oxides, organic semiconductors, metallic inks, and ultra-thin crystalline semiconductors lifted off of a wafer. A variety of flexible electronics have been demonstrated with such materials, but these novel materials suffer from inferior optical and electronic characteristics compared to conventional crystalline materials on a wafer. This inferior performance imposes limitations to the performance and functionality of devices based on these materials. As a result, the trend in flexible electronic devices is to use rigid, wafer based circuits bonded onto flexible or stretchable substrates to provide semi-rigid (or semi-flexible) devices. For example, there is a relatively mature industry using the equivalent of flexible PCB boards that get populated with rigid wafer based circuits; in this example, the circuits are not flexible but they are attached to a flexible carrier. If these rigid circuits are small compared to the desired curvatures, this can be a satisfactory approach. For complex circuits or large area circuits, such as sensor arrays designed for monitoring some physiological response over a sizeable region of the human body, this approach requires assembly of a large number of small circuits in order to retain a semblance of flexibility and this approach becomes impractical. Similarly, this is impractical for devices needing to bend with large curvatures or otherwise require truly flexible electronic circuits.

A method has been demonstrated to permanently deform a silicon-based electronic circuit to a curved surface by thinning the wafer and applying high pressure to mold the wafer, but this is limited to very shallow curvatures due to the rigid and brittle nature of the silicon wafer.

There have been demonstrations to transfer wafer-based devices or circuits to flexible substrates using a variety of techniques to release them from the wafer; these approaches suffer severe limitations (including lack of stretchability, low device density, and/or incompatibility with conventional device structures) that make them impractical for many applications.

A method to transform a silicon wafer-based circuit into a stretchable circuit has been demonstrated where the wafer is made stretchable by etching through the wafer leaving small silicon islands mechanically connected by narrow silicon bridges. This approach requires routing electrical interconnections over these silicon bridges, precluding the ability to provide high-density interconnections required for complex circuits. This approach also suffers from low density of active circuit area as much of the footprint is consumed by the silicon bridges/interconnects. Such an approach does not appear practical or useful for complex circuits.

In view of these and other shortcomings appreciated by those skilled in the art, the inventor has recognized beneficial and advantageous solutions realized and enabled by the embodied invention. These solutions are in the form of stretchable/conformable electronic or optoelectronic circuits and methods for fabricating such stretchable/conformable electronic or optoelectronic circuits.

Flexible circuits or devices (without the ability to stretch) only allow bending in one direction at a time; whereas a circuit or device that can conform to complex shapes requires stretching. Thus, as used herein, the terms 'stretchable,' 'conformable' as applied to the embodied electronic or optoelectronic circuits and methods provide one or more degrees of freedom beyond those provided by 'flexible' electronic or optoelectronic circuits as known in the art. For example, a 2D (rectangular, x by y) 'flexible' electronic circuit can assume planar and non-planar topologies wherein the x- and y-dimensions will change in shape/contour but not in magnitude; whereas, the x- and/or y-dimensions of a 2D (rectangular, x by y) 'stretchable/conformable' electronic circuit may be elongated/stretched (e.g., by up to 50% as necessary to conform to a hemispherical surface).

SUMMARY

An aspect of the invention is a stretchable, conformable, or deformable electronic or optoelectronic circuit comprised of a wafer-based circuit and a stretchable backplane that is monolithically integrated with the circuit. The wafer-based circuit is made stretchable by etching, dicing, cleaving, or otherwise segmenting the wafer into two or more small (e.g. <1 mm wide) segments. These segments are affixed and electrically interconnected through the stretchable backplane. The lateral dimensions of the wafer segments are sized to provide flexibility and stretchability suitable for the circuit to conform to the desired curvatures and topologies. The monolithically integrated backplane allows formation of high-density and highly-interconnected circuits suitable for a wide range of applications.

In various non-limiting embodiments, the stretchable circuit may include, alone or in various combinations as one skilled in the art would understand, the following limitations, features, characteristics and/or elements:
Silicon-based circuit fabricated using conventional CMOS fabrication technology.

Wafer-based circuit with dedicated sacrificial regions that will be etched to segment wafer into small pieces.

An integrated circuit containing basic circuit elements including transistors, resistors, capacitors, inductors, and/or transducers including photodetectors, bolometers, acoustic sensors, microphones, accelerometers, gyroscopes, chemical sensors, pressure sensors, temperature sensors, voltage sensors, capacitance sensors, etc.

A hybrid circuit containing non-silicon based devices (such as lead-salt or other infrared photodetectors) in conjunction with silicon-based devices.

Short-range interconnects fabricated using conventional BEOL (back end of line) metallization techniques to provide interconnection on a single wafer segment.

Through-silicon-vias (TSVs) routing signals through the wafer.

Polymer backplane that provides long-range interconnections between wafer segments and/or connection to other circuits or external electronics.

Stretchable polymer backplane that can be stretched one or many times; for example, a thermo-formable polymer may be used to permanently deform the circuit into a desired shape, while an elastomeric polymer may be used to provide permanent stretchability.

A polymer backplane that is monolithically integrated onto the wafer after completion of BEOL processing.

Multilayered interconnects embedded in, on or beneath the polymer backplane.

An aspect of the invention is a method for fabricating a stretchable/conformable or deformable electronic or optoelectronic circuit. The method utilizes a stretchable/conformable or deformable polymer backplane that mechanically holds segments of a circuit, electrically interconnects the circuit, and may provide interface to external electronics that are not part of the stretchable, conformable or deformable circuit. This backplane may be monolithically integrated onto the front or back of a wafer-based circuit or in-between two wafer based circuits before the wafer is segmented into pieces to facilitate stretching, conforming or deforming. Additionally, or alternatively, wafer based circuits may be bonded onto the stretchable polymer backplane.

In an exemplary, non-limiting embodiment the method includes the steps of: (1) design and fabrication of a circuit on wafer with provision for sacrificial regions that will be used to etch/segment the wafer and designated interconnect points that will be used to electrically interface with the rest of the circuit through a polymer backplane. If the circuit components are fabricated on the frontside of the wafer in relation to a polymer backplane that will be fabricated on the backside of the wafer, the designated interconnect points may be located on the backside of the wafer and be connected to the circuit on the frontside of the wafer using through-silicon-vias (TSVs) to route signals through the thickness of the wafer allowing interconnection at the backside of the wafer. (2) A stretchable, conformable or deformable polymer backplane with interconnects is fabricated on the backside of the wafer, for example, using the steps below:

Applying and patterning a thick photoresist to expose the designated interconnect points;

Electroplating a metal, such as copper, to form ~20μm tall contact pillars and stripping the photoresist;

Coating wafer surface with a fluid polymer layer such as an uncured and uncrosslinked PDMS (such as Dow Corning Sylgard 184) allowing the polymer to flow in between contact pillars;

Vacuum degassing to remove air bubbles;

Flattening and planarizing the polymer by applying pressure from above using a non-stick planar surface such as a Teflon coated silicon wafer;

Crosslinking the PDMS by curing at room temperature or elevated temperature such as 100° C.;

Dry (plasma), wet (chemical) or mechanical (lapping) to clean and expose contact pillars of any residual PDMS;

Evaporating metal over the surface of the crosslinked polymer and exposed contact pillars;

Patterning photoresist to define the first interconnect pattern;

Etching away unwanted metal, effectively transferring the pattern into the metal;

Stripping photoresist;

Repeat the above steps to pattern multiple interconnect layers separated by PDMS;

Last, a thick PDMS layer may be applied on top of the interconnect layers to provide additional polymer thickness for improved handling and stretchability;

(3) After completion of the polymer backplane and interconnects, the wafer will be segmented, for example, by etching through the wafer with a deep reactive ion etch such as the Bosch process. Once the wafer has been segmented the circuit becomes flexible, stretchable, conformable and/or deformable according to the mechanical properties of the polymer backplane.

In various non-limiting embodiments, the method may include, alone or in various combinations as one skilled in the art would understand, the following steps, limitations, features, characteristics and/or elements:

An elastomeric polymer backplane formed, for example, using PDMS;

A thermo-formable polymer backplane formed, for example, using polyethylene terephthatlate (PET) or glycol-modified PET (PETg);

Melting a cross-linked polymer for wafer coating then cooling to re-crosslink the polymer;

Chemically cured and cross-linked polymers;

More than one polymer type to achieve desired mechanical, electrical, optical, and/or thermal properties;

Etching polymer to expose designated interconnect points at any level of a single or multilayer interconnected backplane;

Lift-off patterning of metal interconnects;

Ink-jet printing of metal interconnects from stretchable and/or nanoparticle metallic inks;

Screen printing of metal interconnects;

Metal patterns designated for thermal management to facilitate heat transport to/from the circuit through the polymer backplane;

Metal patterns designated for ground planes;

Metal-to-polymer adhesion layers such as evaporated titanium before metal deposition;

Polymer-to-wafer adhesion promotion, such as oxide etching, surface roughening via argon-plasma etching, or surface functionalization via oxygen-plasma etching;

Wafer thinning to facilitate narrow segmentation etch widths and small pitch TSVs;

Thermoforming or otherwise molding the final circuit into a desired shape; and

Bonding the circuit to a rigid carrier such as a metal, plastic or glass mold or panel, for example, using an epoxy or other adhesive.

BRIEF DESCRIPTION OF THE DRAWINGS

One or more aspects of the present invention are particularly pointed out and distinctly claimed as examples in the claims at the conclusion of the specification. The foregoing and other objects, features, and advantages of the invention are apparent from the following description taken in conjunction with the accompanying drawings in which:

DESCRIPTION OF NON-LIMITING, EXEMPLARY EMBODIMENTS

An embodiment of the invention is a fabrication process to make stretchable, conformable electronic or optoelectronic devices, circuits, or systems. Initially, a custom, wafer-based circuit is designed and manufactured using conventional microelectronics fabrication processes. This circuit will be designed to have multiple segments (islands) that are electrically isolated from each other. These segments/islands may contain one or more devices or circuit elements. Flexible, stretchable, and/or deformable interconnects are then fabricated onto the wafer to provide interconnection between these isolated segments of the circuit. The interconnects may be metallic "wires" fabricated on-top and/or embedded-inside of a polymeric (i.e., plastic, rubber, etc.), thin glass, foil and/or other flexible, stretchable, conformable supporting medium. These "wires" may be printed and/or lithographically defined in conjunction with conventional microelectronics deposition methods including evaporation, sputtering, chemical vapor deposition, electroplating, lithographic patterning, and others as known in the art. The interconnects may be multilayered, allowing for formation of complex interconnection patterns. Different interconnect layers of a multilayered interconnect may be separated by one or more layers of a supporting and/or insulating medium; not all layers will necessarily need to be stretchable if they do not inhibit the flexibility and/or stretchability of the completed device, circuit, or system. The interconnects will provide a flexible handle that will give mechanical support to the wafer segments after the circuit is made stretchable/conformable. Finally, the circuit is made stretchable/conformable by mechanically isolating the wafer segments by dicing, etching-through, or otherwise partitioning the wafer. Etching may be performed all the way through the wafer or only part way through the wafer to achieve the desired flexibility (bendability) for the circuit. The resulting interconnected and stretchable/conformable circuit may be encapsulated and/or packaged and it may be integrated as the whole, or part of, a system or device. The resulting system or device may or may not be flexible, stretchable, or conformable, as such circuits may be included in rigid systems or devices to provide improved mechanical robustness and impact resistance.

Figure 1A:
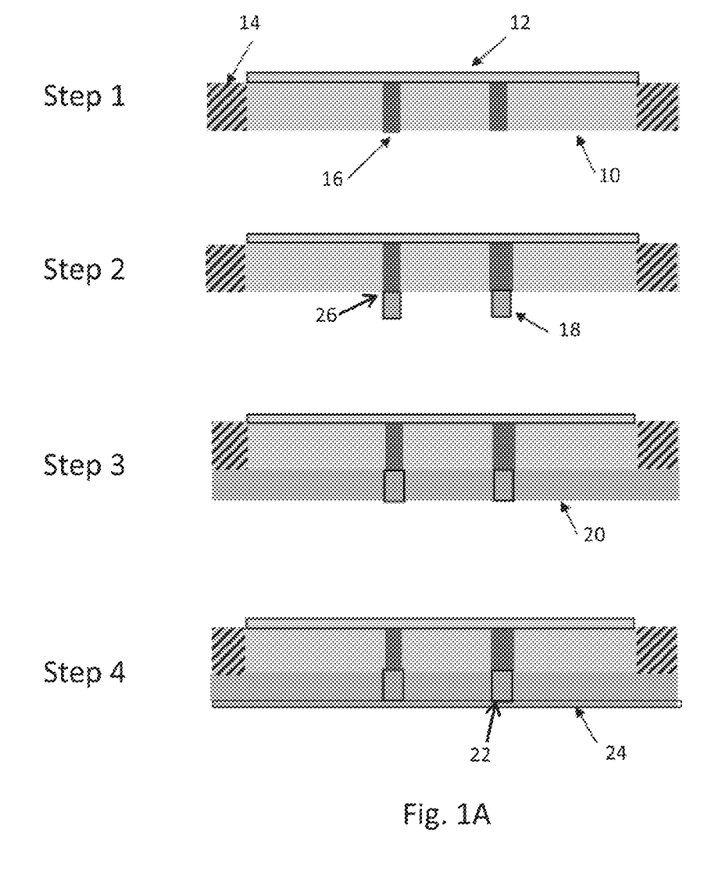
FIG. 1A is a schematic representation of an illustrative embodiment of the fabrication process steps of a stretchable/conformable electronic or optoelectronic circuit.
Figure 1B:
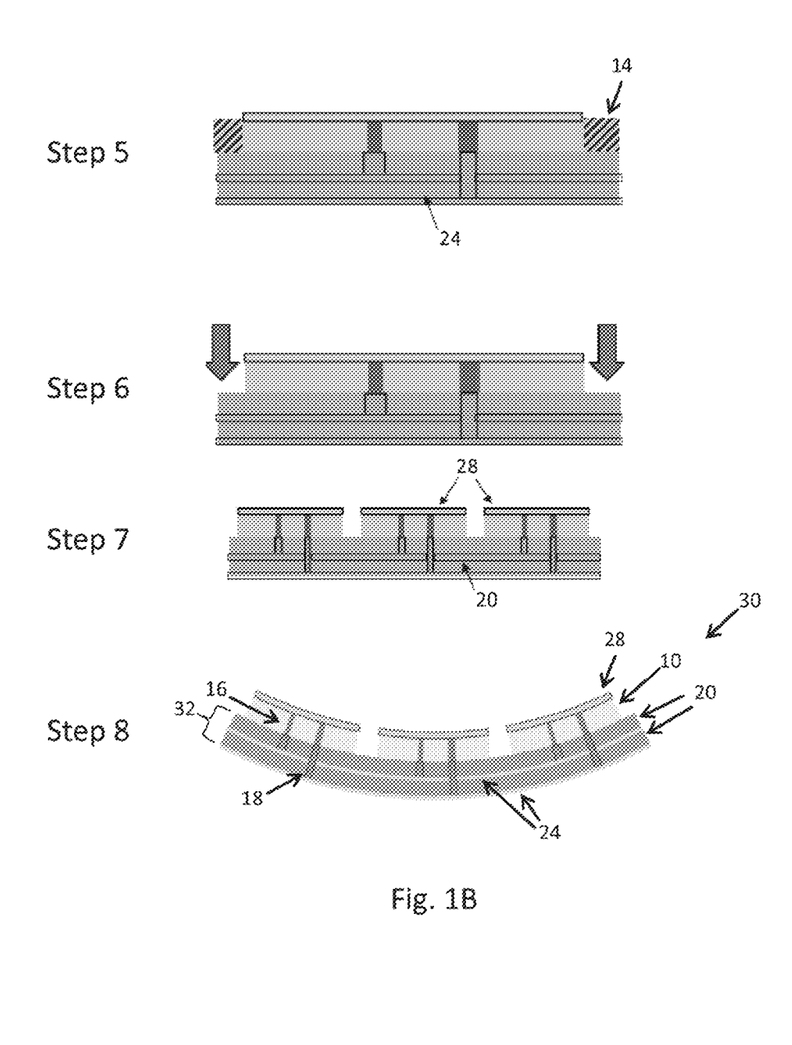
FIG. 1B is an additional schematic representation of the illustrative embodiment of the fabrication process steps of the stretchable/conformable electronic or optoelectronic circuit of FIG. 1A.
Figure 7A:
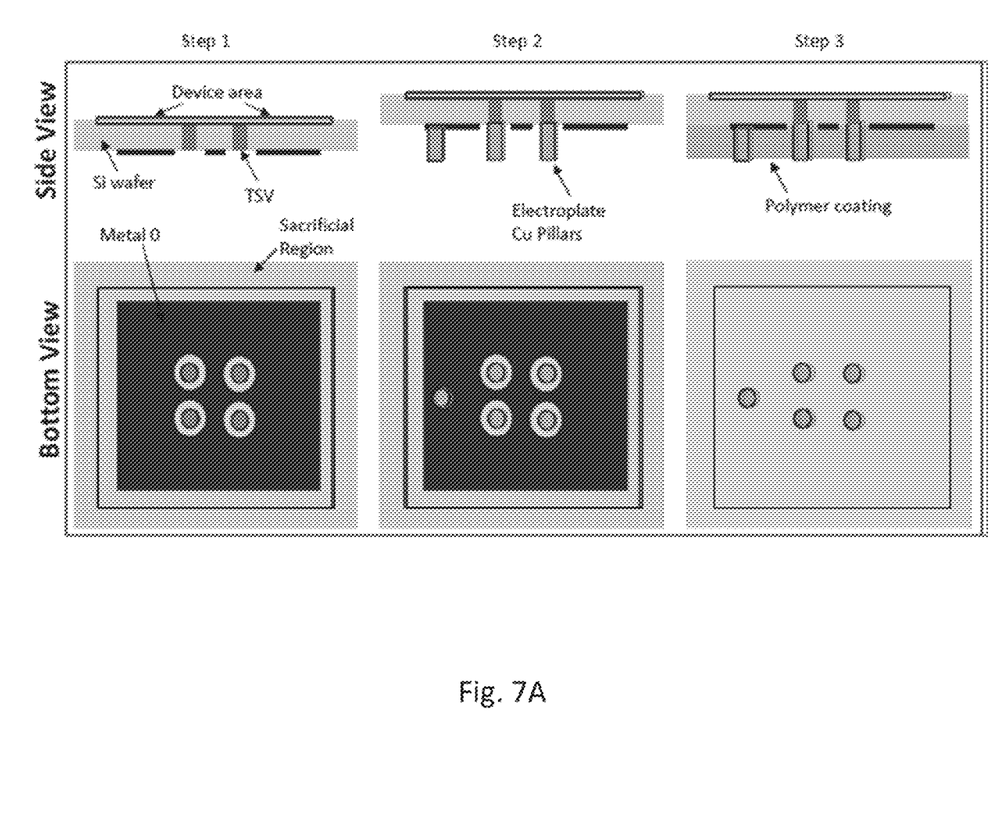
FIG. 7A is a schematic representation of another illustrative embodiment of a fabrication process steps of a stretchable/conformable electronic or optoelectronic circuit.
Figure 7B:
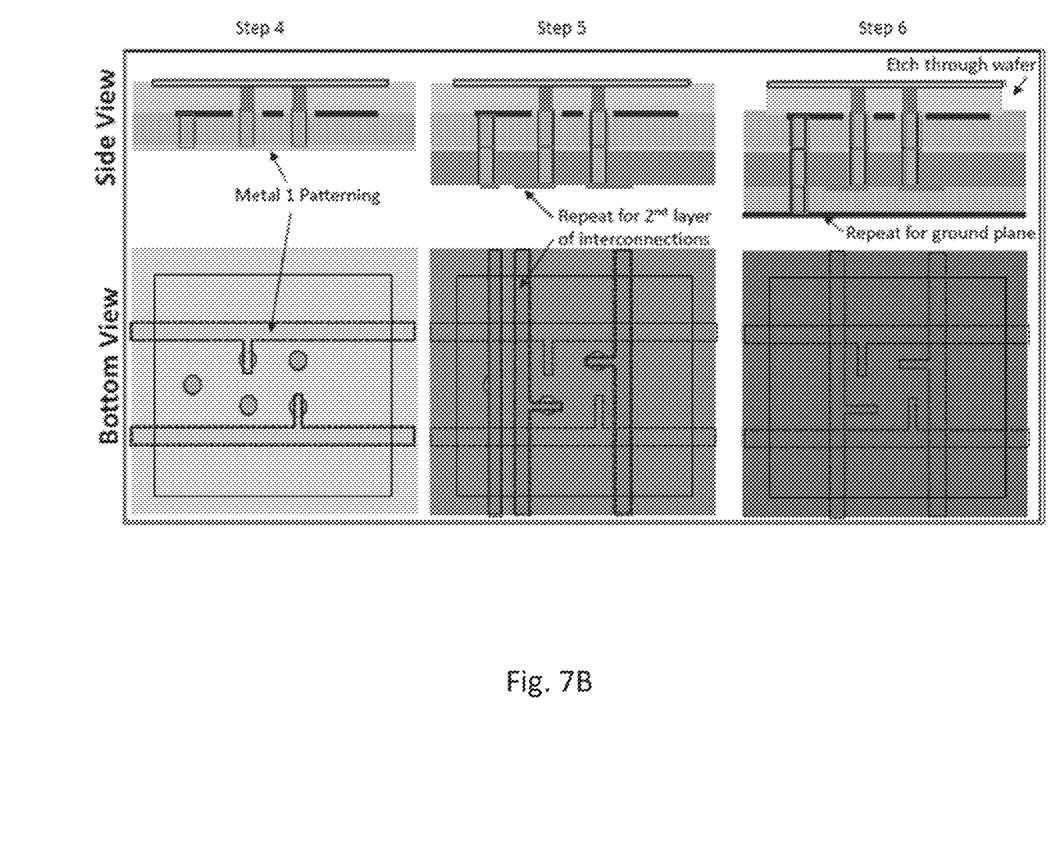
FIG. 7B is an additional schematic representation of the illustrative embodiment of the fabrication process steps of a stretchable/conformable electronic or optoelectronic circuit in FIG. 7A.

FIGS. 1A-1B schematically illustrates the fabrication process steps of a stretchable/conformable electronic or optoelectronic circuit 30. (FIGS. 7A-7B show both top and side views on the fabrication steps of the stretchable/conformable electronic or optoelectronic circuit 30 of FIGS. 1A-1B). In step 1, circuitry is fabricated on a Si wafer 10 using conventional fabrication techniques (i.e., wafer based techniques such as the CMOS process). This wafer 10 is complete with electronic/optoelectronic devices 12, short-range interconnects 24 and, when necessary, through-Si-vias (TSVs) 16. The sacrificial regions 14 which will be etched are shown on either side of the Si wafer 10.

In step 2, thick metal pillars (10 μm, Cu) 18 are fabricated on designated interconnect points to extend these contacts vertically. As illustrated, these designated interconnect points may be the bottom 26 of the TSVs 16 themselves to minimize the footprint of interconnects. These pillars 18 may be fabricated by a variety of well-known metal deposition techniques including, for example, copper electroplating from a seed layer through a photoresist.

In step 3, a polymer coating 20 is applied to fill in-between the metal pillars 18. This polymer 20 may be an elastomeric material (such as PDMS), a thermo-formable material (such as PET), or other polymer that can provide the desired mechanical properties and be coated to fill between metal pillars 18. Polymer coating 20 may be performed by spin-coating, drop casting, transfer printing, injection molding, etc. Methods such as spin-coating may coat the top of the metal pillars 18 with polymer 20 and this can be removed, for example, by plasma etching to provide an electrically accessible interconnect point at the distal end 22 of the metal pillar 18.

In step 4, the first interconnect layer 24 is patterned on top of the polymer layer 20 formed in step 3. This interconnect 24 will electrically connect some of the metal pillars 18 and route signals across the top of the polymer 20. This interconnect layer 24 may be fabricated by lithographic methods similar to conventional patterning on a wafer 10 (i.e., etching or lift-off techniques) using processes compatible with the mechanical, optical, thermal and chemical stability of the polymer 20. Such interconnects 24 also may be patterned using more novel techniques such as stamp transfer patterning or printing.

In step 5, steps 2-4 can be repeated one or more times to form multilayered contacts allowing the formation of complex interconnects 24 suitable for complex circuits. These interconnects 24 may connect to multiple designated interconnect points per island, may connect adjacent islands (i.e., intermediate range interconnects), may connect islands to other parts of the polymer backplane 20 or out from the local circuit (consisting of a multiplicity of Si islands) to external electronics or circuits (i.e., long range interconnects). After completion of the interconnect layers 24, additional polymer 20 may be applied to add thickness to achieve the desired mechanical properties.

In step 6, the wafer 10 is segmented into small, yet interconnected, segments 28. The segmentation may be accomplished by dicing, cleaving, etching, laser ablation, focused ion-beam milling, etc. For example, a deep reactive ion etch (DRIE) using the Bosch process is an ideal way to etch through the wafer 10 with high-aspect ratio allowing for a minimal sacrificial region 14, maximum wafer active area and high-density circuitry. Thin wafers 10 may be utilized to maximize the resolution of such etching and the density of interconnects routed through the wafer 10 with TSVs 16. After the wafer 10 is segmented, the Si islands 28 remain affixed in place by adhesion to the flexible polymer backplane 20 and/or bonding of the embedded metal pillars 18 to the Si island 28. The Si islands 28 remain electrically interconnected through the flexible polymer backplane 20. After completion of etching, the circuit 30 becomes flexible, conformable and stretchable based on the properties of the polymer backplane 20.

In step 7, the flexible, conformable and stretchable circuit 30 can be deformed to the desired shape. The minimum radius of curvature should be much larger than the width of the Si islands 28 as shown. Island 28 size can vary depending on circuit requirements, but typically is expected to be in the range of 10-1000 μm for a hemispherical imager. Similarly, the number of designated interconnect points and/or TSVs 16 can vary, but typically is expected to be in the range of 4-64 for a hemispherical imager.

Figure 2A:
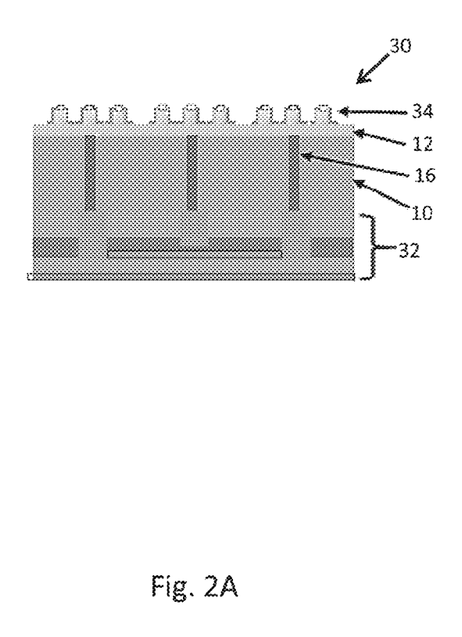
FIG. 2A is a schematic representation of an illustrative embodiment of three interconnected layers prior to etching the Si wafer.
Figure 2B:
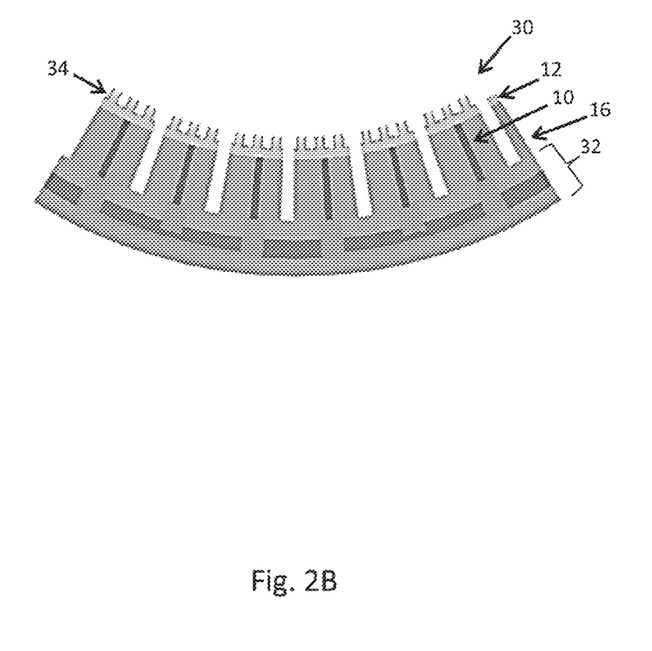
FIG. 2B is a schematic representation of the three interconnected layers of FIG. 2A after etching the Si wafer.

FIG. 2A and FIG. 2B, respectively, illustrate three interconnect layers 32 before and after etching the Si wafer 10 to make it stretchable and conformable. In FIG. 2B, the total thickness of the three interconnect layers 32 is between about 100-200 microns. The total device 30 thickness is between about 300-800 microns. The device 30 of FIGS. 2A-2B comprises CMOS layers 12 with IR detectors 34.

Figure 3:
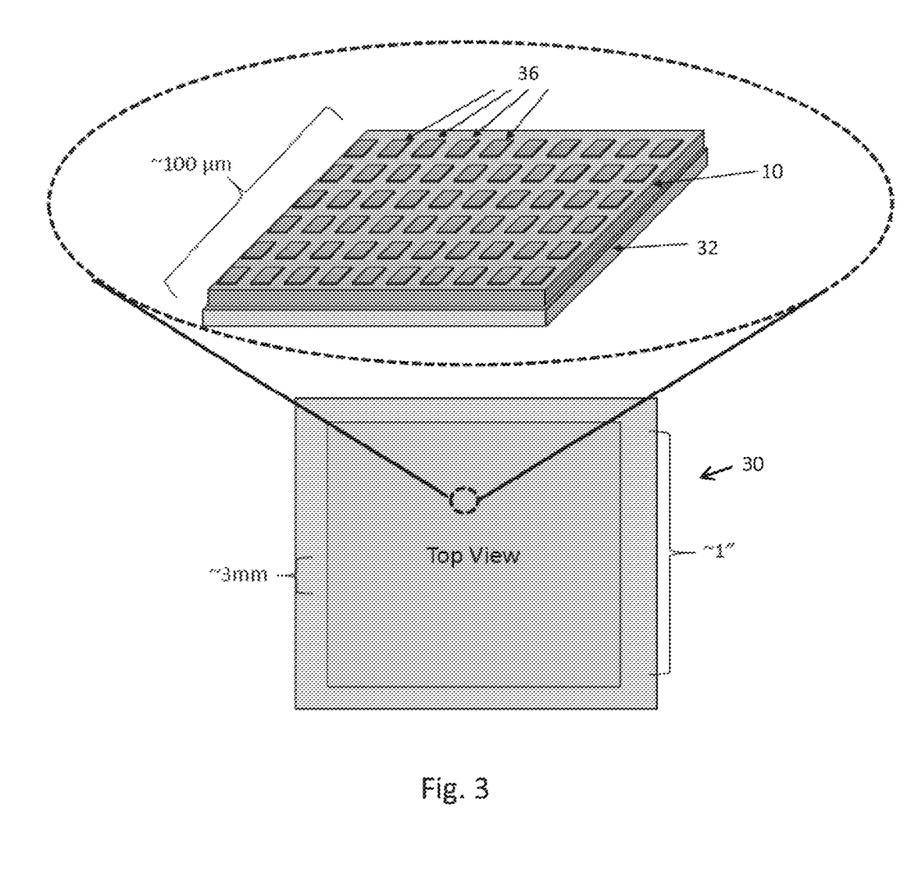
FIG. 3 is a schematic representation of an illustrative embodiment of dimensions and array of PbSe pixels on Si of the stretchable/conformable electronic or optoelectronic circuit at step 5 of FIG. 1B.

FIG. 3 schematically illustrates in a perspective view the device 30 at step 5 in FIG. 1B (before wafer segmentation), further showing exemplary dimensions and an array of PbSe pixels 36 (apprx. 10 μm) on Si 10 (i.e., Si ROIC) on the interconnected PDMS backing 32 for an IR imager application. The structure shown above in FIG. 3 forms a small portion of the overall device 30 shown below.

Figure 4:
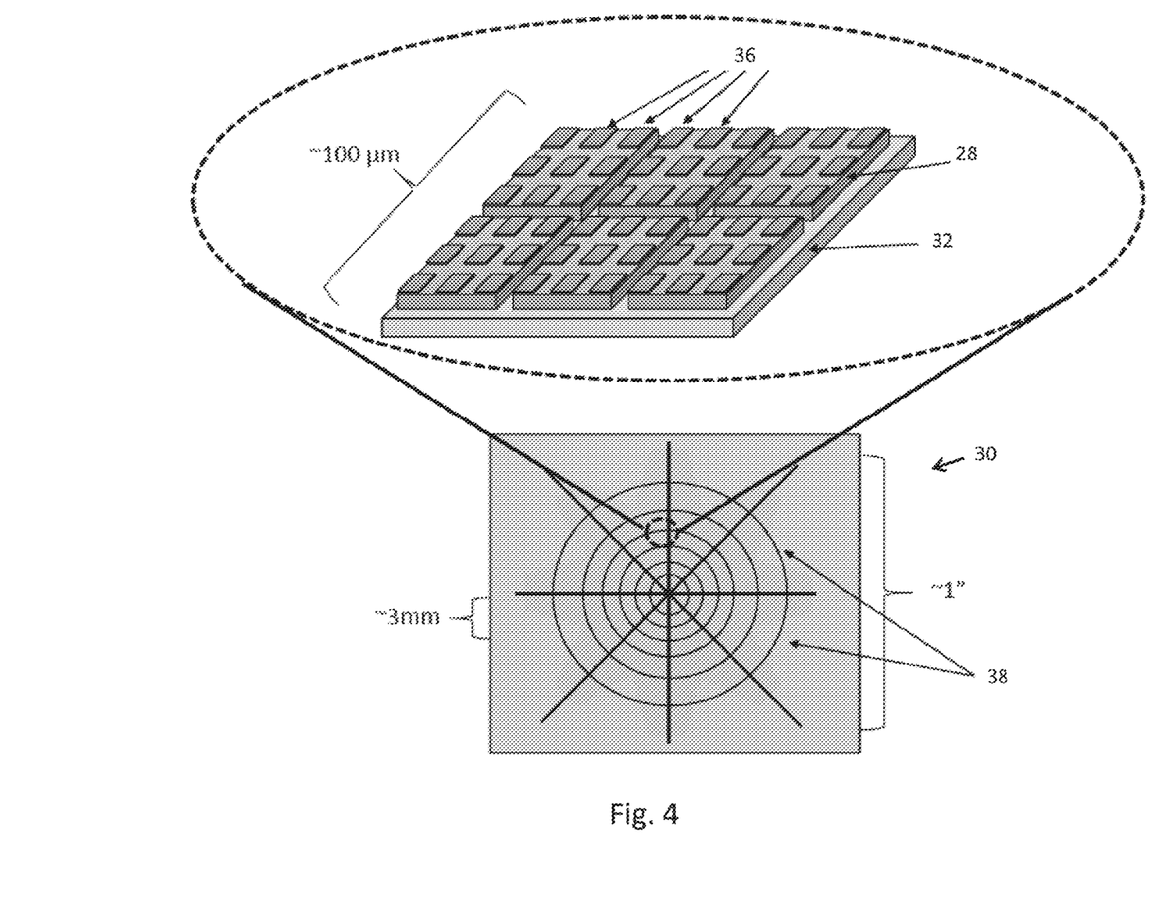
FIG. 4 is a schematic representation of an illustrative embodiment of dimensions and array of Pb Se pixels on isolated Si of the stretchable/conformable electronic or optoelectronic circuit at step 6 of FIG. 1B.

FIG. 4 schematically illustrates in a perspective view the device 30 at step 6 in FIG. 1 (after wafer segmentation), further showing exemplary dimensions and multiple arrays of pixels 36 (e.g., apprx. 10 μm PbSe pixels) on isolated Si islands (i.e., segments) 28 on the interconnected PDMS backing 32. The structure shown above in FIG. 4 forms a small portion of the overall device illustrated below in FIG. 4. The overall device 30 has spacing 38 between the Si islands 28, which provides a configuration to better facilitate deformation to a hemisphere.

Ultimately, scaling and interconnect density are a concern. This is especially true for circuit architectures that require TSV interconnects where the relatively large TSV diameter limits the density of interconnections through a wafer. The minimum TSV pitch is approaching 5 μm using thin wafers and is expected to reach ~1 μm by the year 2020. In the context of a stretchable image sensor utilizing TSV feedthroughs, for example, an individual pixel in the sensor may require anywhere from 2-8 input/output (I/O) lines for power, control and readout; yet, advanced CMOS pixels can be smaller than 1 μm on an edge. Consequently, the footprint required for I/O may be much larger than the desired pixel footprint if pixels are directly connected with TSVs; this would lead to undesirably low imager resolution. The number of I/O lines per pixel can be reduced by including multiplexing capability in the CMOS circuitry and packing numerous pixels onto a single segment of the wafer. Pixels on a single segment can then share TSVs and interconnects across the polymer backplane allowing formation of advanced image sensors with a high density of complex pixels.

Figure 5A:
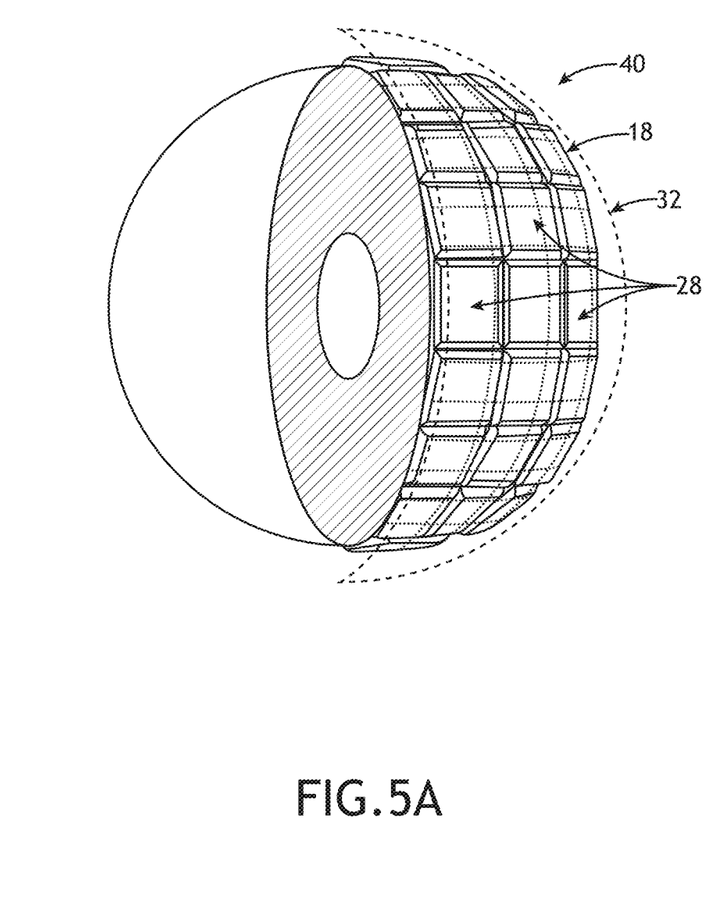
FIG. 5A is a schematic representation of a stretchable/conformable electronic or optoelectronic circuit of FIG. 4 stretched over and conformed to a hemispherical lens to form an image.
Figure 5B:
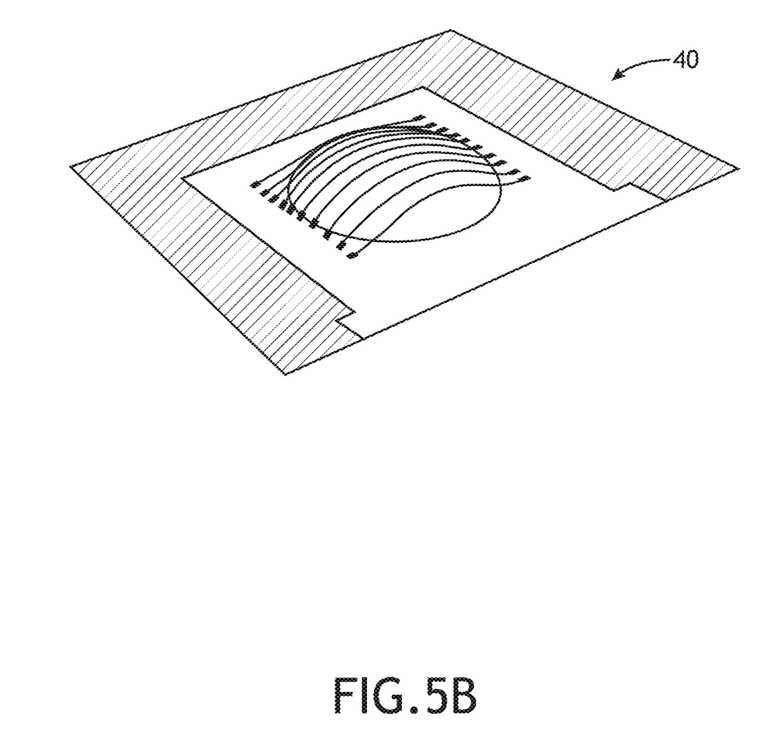
FIG. 5B is an exemplary embodiment of metal patterns defined on flat PETg and thermoformed into a spherical cap.
Figure 6:
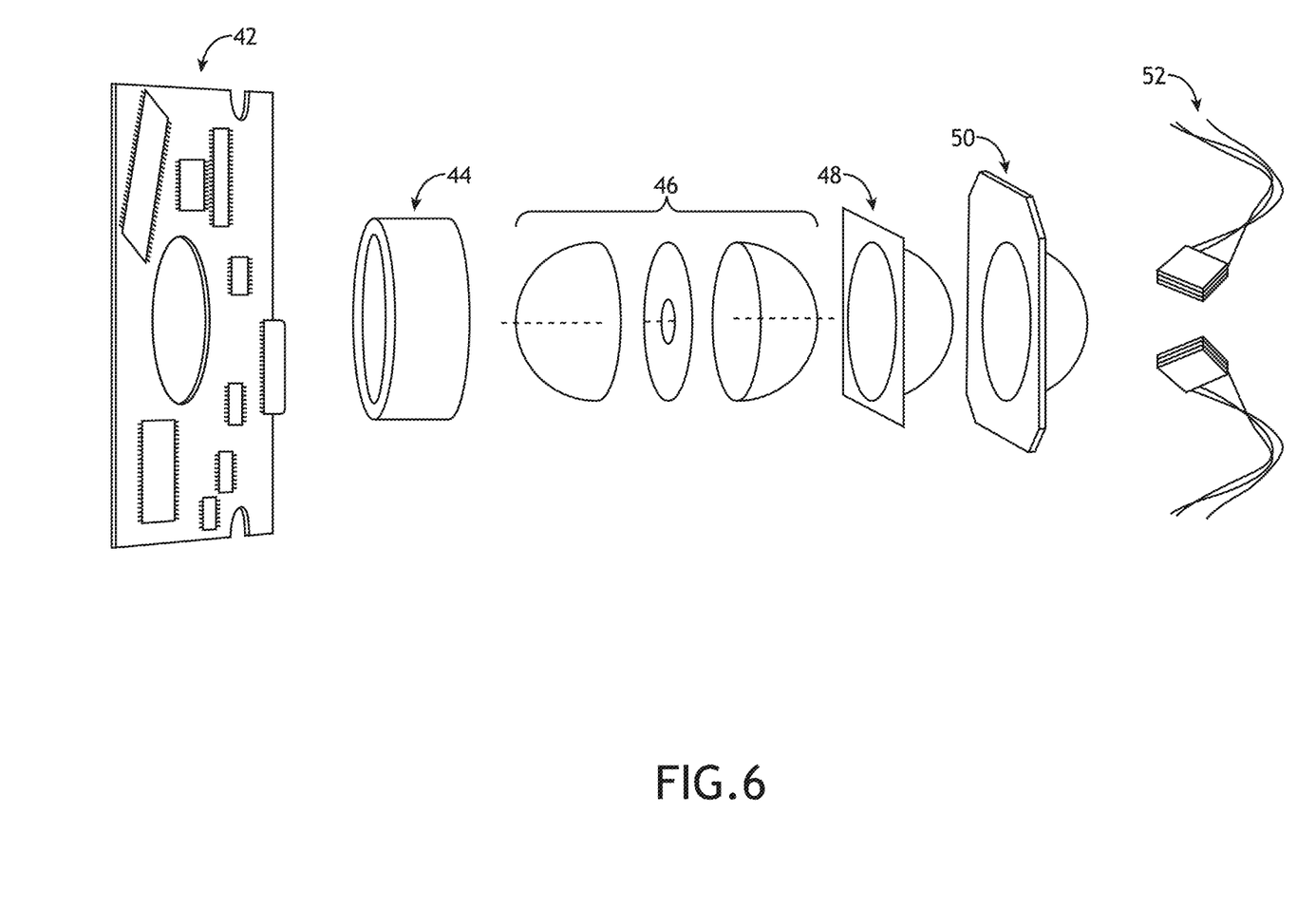
FIG. 6 is a schematic representation of a mold incorporated into the stretchable/conformable electronic or optoelectronic circuit.
Figure 8:
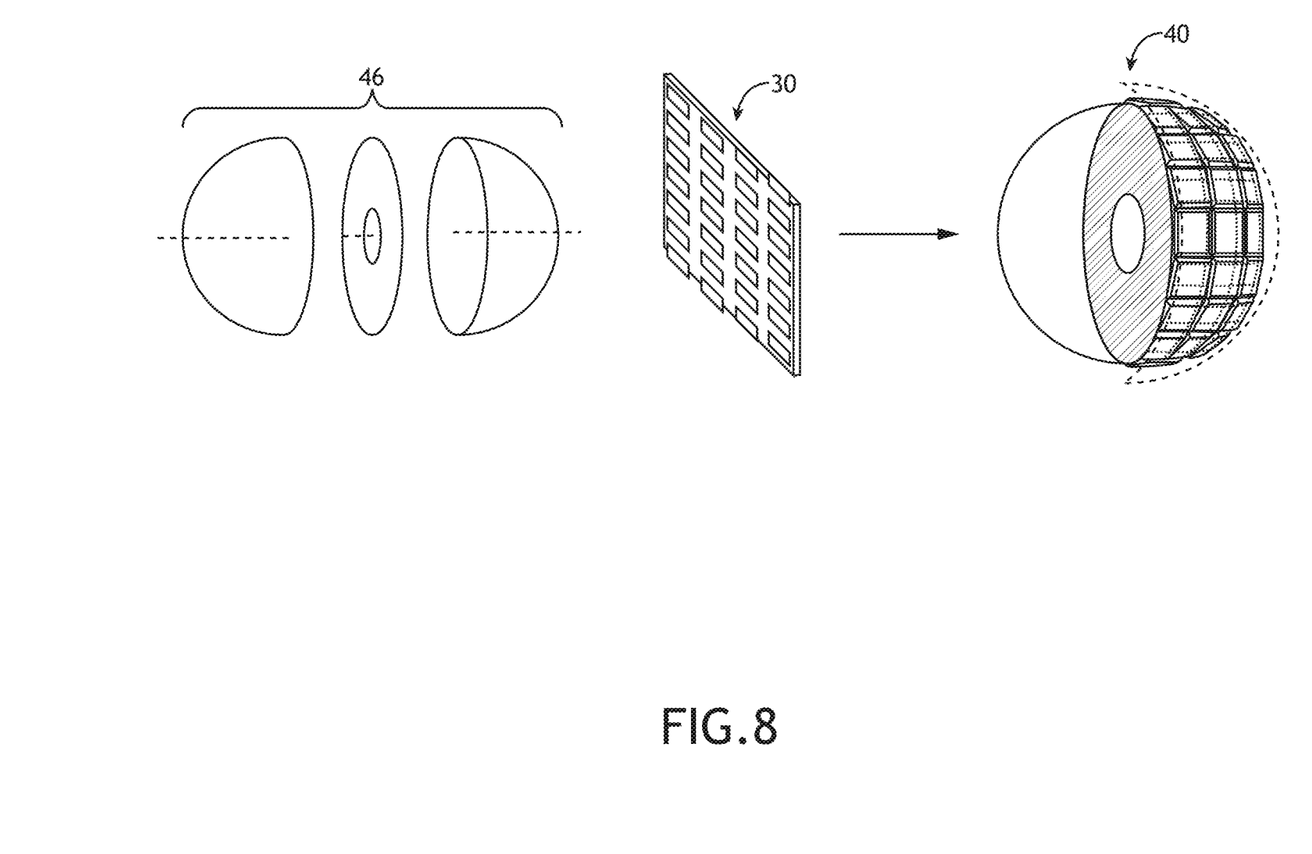
FIG. 8 is a schematic representation of the lens assembly and stretchable FPA components comprising a HFPA.

FIG. 5A schematically illustrates a stretchable/conformable optoelectronic circuit as illustrated in FIG. 4 stretched over and conformed to a hemispherical lens to form an imager (FIG. 8 shows a lens assembly 46 and stretchable FPA 30 used to form a HFPA 40). FIG. 5B shows exemplary metal patterns defined on flat PETg and thermoformed into a spherical cap 40. A vacuum mold or other fixture may be used to enable the proper stretching and conformation shapes and sizes. Such a mold could be a permanent component of a finished system as schematically illustrated in FIG. 6. FIG. 6 shows front end electronics 42; a Dewar cover 44; lens assembly 46; flexible FPA 48; 3D mold, heat sink, and Dewar base 50; and TECs 52.

A contemplated embodiment of the invention utilizes a thermo-formable (i.e., non-elastomeric) polymer, such as polyethylene terephthalate (PET), for the stretchable/deformable backplane. The polymer may be applied, for example, by direct polymerization on the wafer, injection molding or other melt-based application process. After fabrication of the polymer backplane and etching of the wafer using a process similar to that shown in FIGS. 1A-1B, the circuit could then be permanently thermo-formed to the desired shape, for example, using a heated vacuum mold, enabling fabrication of semi-rigid but highly contoured circuit. The inventors have shown that interconnects fabricated on PET can survive thermos-forming to a variety of shapes using such a mechanism.

What is claimed:

1. A method comprising:
   fabricating a wafer-based circuit including a plurality of circuit elements distributed across top surfaces of a plurality of spatially-separated wafer segments;
   fabricating one or more through-silicon vias to electrically connect at least some of the plurality of circuit elements to interconnect points on a bottom surface of the wafer;
   fabricating metal pillars on at least some of the interconnect points to extend these contacts vertically from the bottom surface of the wafer;
   applying a polymer layer to the bottom surface of the wafer to form a backplane;
   patterning an interconnect layer on top of the polymer layer, wherein the interconnect layer provides electrical connections between at least some of the metal pillars;
   segmenting the wafer into a plurality of spatially-separated wafer segments, wherein at least one of spacings between the plurality of wafer segments or orientations of the plurality of wafer segments is adjustable by at least one of stretching or flexing the backplane.

2. The method of claim 1, further comprising the step of: adjusting at least one of spacings between the plurality of wafer segments or orientations of the plurality of wafer segments to a desired shape.

3. The method of claim 1, wherein segmenting the wafer into a plurality of spatially-separated wafer segments comprises:
etching through at least a portion of the wafer.

4. The method of claim 1, further comprising the step of: conforming the plurality of spatially-separated wafer segments to a hemispherical lens.

5. The method of claim 2, further comprising: conforming the plurality of spatially-separated wafer segments to a mold, wherein the desired shape is the shape of the mold.

6. The method of claim 1, wherein the metal pillars are composed of copper.

7. The method of claim 1, wherein the polymer is formed from at least one of an elastomeric or a thermo-formable material.

8. The method of claim 1, wherein the polymer is a thermos-formable material.

9. The method of claim 1, wherein a first portion of the metal pillars extend to a first length, wherein a second portion of the metal pillars extend to a second length, wherein the polymer layer is a first polymer layer, wherein the interconnect layer is a first interconnect layer, wherein the first interconnect layer connects to the portion of the metal pillars having the first length, wherein the method further comprises:
applying a second polymer layer on the first interconnect layer;
fabricating a second interconnect layer on the second polymer layer, wherein the second interconnect layer connects to the portion of the metal pillars having the second length.

10. The method of claim 1, further comprising:
fabricating additional metal pillars on at least some of the interconnect points to extend these contacts vertically from the bottom surface of the wafer;
applying an additional polymer layer to the polymer layer; and
patterning an additional interconnect layer on top of the additional polymer layer, wherein the additional interconnect layer provides electrical connections between at least some of the additional metal pillars.

11. The method of claim 1, further comprising:
conforming the wafer segments are conformed to a hemispherical lens to form an imager.

12. The method of claim 1, wherein at least some of the plurality of circuit elements of the wafer-based circuit comprise:
photodetectors.

13. The method of claim 12, wherein at least some of the photodetectors comprise:
an array of PbSe pixels.

14. The method of claim 1, wherein the polymer layer comprises polyethylene terephthalate (PET).

15. The method of claim 1, further comprising:
fabricating an encapsulation layer covering at least a back surface of the backplane.

\* \* \* \* \*